United States Patent [19]
Hung et al.

[11] Patent Number: 6,140,763
[45] Date of Patent: Oct. 31, 2000

[54] INTERFACIAL ELECTRON-INJECTING LAYER FORMED FROM A DOPED CATHODE FOR ORGANIC LIGHT-EMITTING STRUCTURE

[75] Inventors: Liang S. Hung, Webster; Joseph K. Madathil; Ching W. Tang, both of Rochester, all of N.Y.

[73] Assignee: Eastman Kodak Company, Rochester, N.Y.

[21] Appl. No.: 09/124,150

[22] Filed: Jul. 28, 1998

[51] Int. Cl.[7] ................ H01J 1/62; H01J 63/04
[52] U.S. Cl. .............. 313/503; 313/504; 313/506; 428/690
[58] Field of Search ..................... 313/503, 504, 313/506; 428/690, 917; 427/66

[56] References Cited

U.S. PATENT DOCUMENTS

| | | |
|---|---|---|
| 3,530,325 | 9/1970 | Mehl et al. . |
| 3,621,321 | 11/1971 | Williams et al. . |
| 4,356,429 | 10/1982 | Tang . |
| 4,539,507 | 9/1985 | VanSlyke et al. . |
| 4,720,432 | 1/1988 | VanSlyke et al. . |
| 4,769,292 | 9/1988 | Tang et al. . |
| 4,885,211 | 12/1989 | Tang et al. . |
| 5,047,607 | 9/1991 | Briffod . |
| 5,429,884 | 7/1995 | Namiki et al. ............... 428/690 |
| 5,969,474 | 10/1999 | Arai ............................. 313/504 |
| 5,989,737 | 11/1999 | Xie et al. ...................... 428/690 |
| 6,013,384 | 1/2000 | Kido et al. ................... 428/690 |
| 6,023,073 | 2/2000 | Strite .............................. 257/40 |
| 6,023,371 | 2/2000 | Onitsuka et al. ............ 359/620 |

*Primary Examiner*—Nimeshkumar D. Patel
*Assistant Examiner*—Karabi Guharay
*Attorney, Agent, or Firm*—Raymond L. Owens

[57] ABSTRACT

An organic light-emitting device including a substrate, an anode disposed over the substrate, an organic light-emitting structure disposed over the anode, a cathode buffer layer disposed over the organic light-emitting structure and formed of a material selected to permit high energy deposition of a cathode, and a cathode disposed over the cathode buffer layer and being provided with an electron-injecting dopant which diffuses across the buffer layer to provide an interfacial electron-injecting layer at the interface between the organic light-emitting structure and the cathode buffer layer.

23 Claims, 9 Drawing Sheets

INTERFACIAL ELECTRON-INJECTING LAYER FORMED FROM A DOPED CATHODE FOR ORGANIC LIGHT-EMITTING STRUCTURE

CROSS REFERENCE TO RELATED APPLICATIONS

Reference is made to related to U.S. application Ser. No. 09/123,602 filed Jul. 28, 1998 entitled "Electron-Injecting Layer Formed From a Dopant Layer for Organic Light-Emitting Structure" to L-S. Hung, and J. Madathil, and U.S. application Ser. No. 09/123,601 filed Jul. 28, 1998 entitled "Electron-Injecting Layer Providing a Modified Interface Between an Organic Light-Emitting Structure and a Cathode Buffer Layer" to L-S. Hung, C. Tang, and P. Raychaudhuri.

FIELD OF THE INVENTION

This invention relates to organic light-emitting devices. More particularly, this invention relates to devices which have an organic cathode buffer layer disposed between a cathode and an organic light-emitting structure, and an electron-injecting dopant diffused from the cathode across the cathode buffer layer.

BACKGROUND OF THE INVENTION

Organic light-emitting devices, also referred to as organic electroluminescent (EL) devices or as organic internal junction light-emitting devices, contain spaced electrodes separated by an organic light-emitting structure (also referred to as an organic EL medium) which emits electromagnetic radiation, typically light, in response to the application of an electrical potential difference across the electrodes. The organic light-emitting structure must not only be capable of producing light efficiently, but must be capable of fabrication in a continuous form (i.e., must be free of pinholes and particle defects) and must be sufficiently stable to facilitate fabrication and to support operation.

Initially organic EL devices were fabricated using single crystals of organic materials, as illustrated by Mehl et al U.S. Pat. No. 3,530,325, and Williams U.S. Pat. No. 3,621,321. Single organic crystal EL devices were relatively difficult to fabricate and further did not readily lend themselves to thin film constructions.

In recent years, preferred organic EL devices have been constructed employing thin film deposition techniques. Using an anode as a device support, the organic electroluminescent medium has been deposited as one or a combination of thin films followed by the deposition of a cathode, also formed as a thin film deposition. Thus, starting with the anode structure, it is possible to form the entire active structure of an organic EL device by thin film deposition techniques. As employed herein, the term "thin film" refers to layer thicknesses of less than 5 $\mu$m, with layer thicknesses of less than about 2 $\mu$m being typical. Examples of organic EL devices containing organic electroluminescent medium and cathode constructions formed by thin film deposition techniques are provided by Tang U.S. Pat. No. 4,356,429, VanSlyke et al U.S. Pat. Nos. 4,539,507 and 4,720,432, and Tang et al U.S. Pat. No. 4,769,292.

While the art has encountered little difficulty in constructing fully acceptable stable anodes for internal junction organic EL devices, cathode construction has been a matter of extended investigation. In selecting a cathode metal, a balance must be struck between metals having the highest electron-injecting efficiencies and those having the highest levels of stability. The highest electron-injecting efficiencies are obtained with alkali metals, which are too unstable for convenient use, while metals having the highest stabilities show limited electron injection efficiencies and are, in fact, better suited for anode construction.

Tang U.S. Pat. No. 4,356,429 teaches to form cathodes of organic EL devices of metals such as indium, silver, tin, and aluminum. VanSlyke et al U.S. Pat. No. 4,539,507 teaches to form the cathodes of organic EL devices of metals such as silver, tin, lead, magnesium, maganese, and aluminum. Tang et al U.S. Pat. No. 4,885,211 teaches to form the cathodes of organic EL devices of a combination of metals, with at least 50 percent (atomic basis) of the cathode being accounted for by a metal having a work function of less than 4.0 eV. VanSlyke U.S. Pat. No. 5,047,607 teaches the use of a cathode containing a plurality of metals, at least one of which is a low work function metal other than an alkali metal. Overlying the cathode is a protective layer comprised of a mixture of at least one organic component of the organic EL medium and at least one metal having a work function in a range of from 4.0 to 4.5 eV, and capable of being oxidized in the presence of ambient moisture.

While it has been contemplated to form cathodes over the organic EL medium from the combination of lower work function (<4.0 eV) electron-injecting metals and higher work function (>4.0 eV) more stable metals by conventional vapor deposition or by high energy sputter deposition or electron beam deposition, high energy deposition has not evolved thus far as a practical approach to form cathodes. It has been observed that electron bombardment and/or ion bombardment of the organic EL medium during sputter deposition or electron beam deposition of a cathode introduces damage into the EL medium. The damage is evidenced by substantially degraded electroluminescence performance of a device when compared to the electroluminescence performance of a device having a cathode formed by conventional thermal vapor deposition.

Thus, although cathodes formed over organic light-emitting structures by sputter deposition or electron beam deposition offer potential advantages of improved adhesion and step coverage, such advantages have not been realized due to the damaging effects related to high energy deposition.

SUMMARY OF THE INVENTION

The present invention has as its purpose to minimize or eliminate damage introduced into an organic light-emitting structure or into an organic EL medium during high energy deposition of a cathode or cathodes.

Accordingly, it is an object of the present invention to provide an organic cathode buffer layer over the organic light-emitting structure as a protection layer against damage during high energy deposition of a cathode over the buffer layer.

It is another object of the invention to provide an organic light-emitting device which has an organic light-emitting structure formed over an anode, an organic cathode buffer layer formed over the light-emitting structure, a cathode disposed over the cathode buffer layer, and an electron-injecting interfacial layer formed at an interface between the buffer layer and the light-emitting structure by an electron-injecting dopant diffused from the cathode across the cathode buffer layer.

It is a further object of the invention to provide an organic light-emitting device having a cathode comprised of a material of a work function greater than 4.0 eV and containing an electron-injecting dopant of a work function less than 4.0 eV, the dopant capable of diffusion from the cathode across an organic cathode buffer layer to an interface between the buffer layer and an organic light-emitting structure.

These objects are achieved in an organic light-emitting device comprising:

a) a substrate;

b) an anode disposed over the substrate;

c) an organic light-emitting structure disposed over the anode;

d) a cathode buffer layer disposed over the organic light-emitting structure and formed of a material selected to permit high energy deposition of a cathode; and e) a cathode disposed over the cathode buffer layer and being provided with an electron-injecting dopant which diffuses across the buffer layer to provide an interfacial electron-injecting layer at the interface between the organic light-emitting structure and the cathode buffer layer.

The drawings are necessarily of a schematic nature, since the thicknesses of the individual layers are too thin, and thickness differences of the various elements too great to permit depiction to scale or to permit convenient proportionate scaling.

High energy deposition, for example sputter deposition, of a cathode enhances the adhesion of a cathode to an organic layer. Sputter deposition also provides a cathode or cathodes conforming over underlying topological features which can be present in an organic light-emitting device having an array of light-emitting pixels formed by a plurality of laterally spaced anodes and a plurality of intersecting laterally spaced cathodes.

An organic cathode buffer layer, formed over an organic light-emitting structure, is stable and protects the light-emitting structure from damage during sputter deposition of the cathode. A cathode contains a low-work function dopant, which diffuses across the cathode buffer layer to form an electron-injecting interfacial layer, thus improving device performance.

High energy deposition, such as sputter deposition or electron beam deposition, permits deposition of cathodes from cathode materials which cannot be readily deposited by conventional thermal vapor deposition.

Cathodes formed to contain more than one cathode material can be readily achieved by sputter deposition from a composite sputter target, thus simplifying the deposition compared to conventional thermal vapor co-deposition from multiple vapor sources.

DESCRIPTION OF THE PREFERRED EMBODIMENTS

Before describing the organic light-emitting devices of the invention, two configurations of prior art organic light-emitting devices will be discussed.

Figure 1:
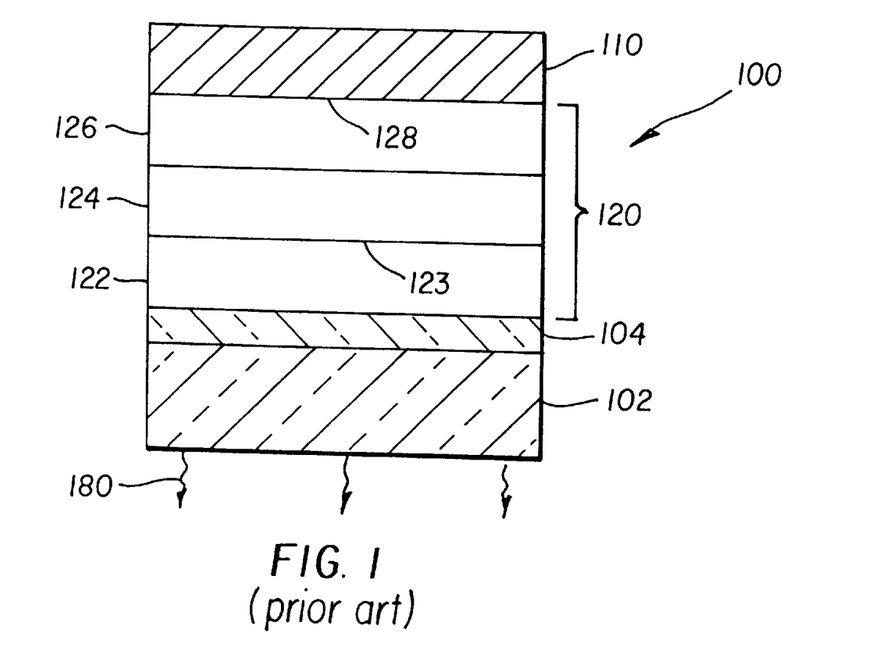
FIG. 1 is a schematic diagram of a prior art organic light-emitting device in which light is emitted through an anode and a support, and having a cathode formed by conventional thermal evaporation of an opaque cathode material composition.

In FIG. 1, an organic light-emitting device 100 has a light-transmissive substrate 102 on which is disposed a light-transmissive anode 104. An organic light-emitting structure 120 is formed between the anode 104 and a cathode 110. The organic light-emitting structure 120 is comprised of, in sequence, an organic hole-transporting layer 122, an organic light-emitting layer 124, and an organic electron-transporting layer 126. When an electrical potential difference (not shown) is applied between the anode 104 and the cathode 110 such that the anode 104 is at a more positive electrical potential with respect to the cathode 110, the cathode 10 will inject electrons into the electron-transporting layer 126 at an interface 128, and the electrons will traverse the electron-transporting layer 126 and the light-emitting layer 124 which also is capable of transporting electrons. At the same time, holes will be injected from the anode 104 into the hole-transporting layer 122, and the holes will migrate across the hole-transporting layer 122, and will recombine with electrons at or near a junction 123 formed between the hole-transporting layer 122 and the light-emitting layer 124. Thus, the organic light-emitting device 100 can be viewed as an internal junction light-emitting device which represents a diode in a forward bias condition when the anode 104 is at a more positive potential than the cathode 110. Under these conditions, injection of holes (positive charge carriers) occurs from the anode 104 into the hole-transporting layer 122, while electrons are injected from the cathode 110 into the electron-transporting layer 126. The injected holes and electrons each migrate toward the oppositely charged electrode, and recombination and hole-electron recombination occurs at the junction 123. When a migrating electron drops from its conduction band potential to a valance band in filling a hole, energy is released as light which, as depicted in the device 100 of FIG. 1, is emitted as light 180 through the light-transmissive anode 104 and substrate 102 for viewing by an observer. The cross hatching of the cathode 110 is intended to indicate that the cathode 110 is optically opaque.

Figure 2:
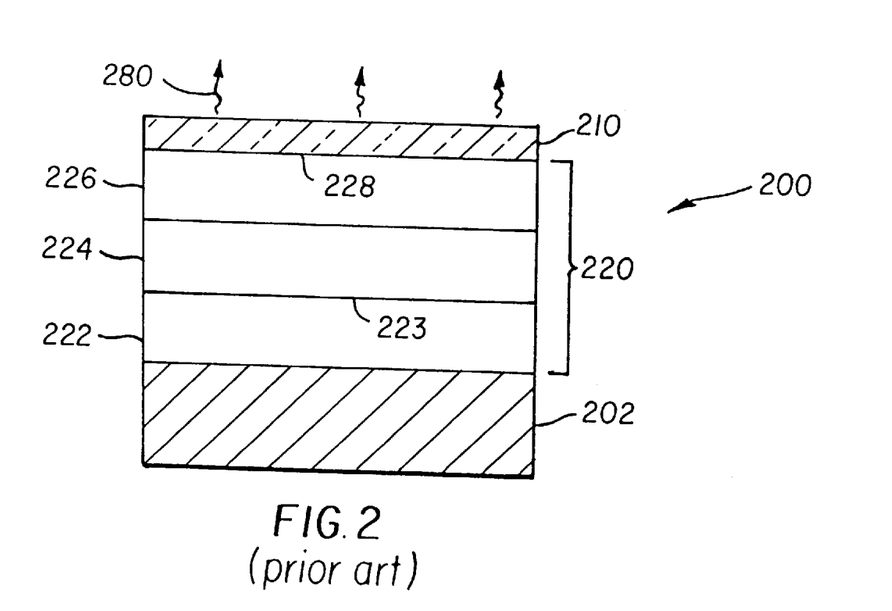
FIG. 2 is a schematic diagram of a prior art organic light-emitting device in which light is emitted through a cathode formed by conventional thermal evaporation of a light-transmissive cathode material composition.

Turning now to FIG. 2, a prior art organic light-emitting device 200 is distinct over the device 100 of FIG. 1 in that a cathode 210 is now light-transmissive, while an electrically conductive and optically opaque substrate 202 also serves as an anode electrode. The organic light-emitting structure 220 and its organic layers 222, 224, and 226, as well as the junction 223 and the interface 228 correspond to the respective elements of FIG. 1. Emitted light 280 is transmitted to an outside observer through the cathode 210 from its origin in the organic light-emitting layer 224 at or near the junction 223.

Turning again to the prior art device 100 of FIG. 1, the light-transmissive substrate 102 may be constructed of glass, quartz, or a plastic material. The anode 104 is preferably constructed of one or a combination of light-transmissive and electrically conductive metal oxides such as indium oxide, tin oxide, or optimally, indium tin oxide (ITO). As employed herein, the term "light-transmissive" means that the layer or element under discussion transmits greater than 50% of the light of at least one wavelength it receives and preferably over a 100 mm interval. In order to function as an effective hole-injecting electrode, the anode 104 must have a work function in excess of 4.0 eV. ITO has a work function of about 4.7 eV.

The organic light-emitting structure 120 is preferably constructed by sequential vapor deposition of the hole-transporting layer 122, the light-emitting layer 124, and the electron-transporting layer 126. Following the teachings of VanSlyke et al. U.S. Pat. No. 4,539,507, hereby incorporated by reference, the hole-transporting layer 122 preferably contains at least one aromatic tertiary amine.

A preferred class of selected aromatic tertiary amines are those which include at least two aromatic tertiary amine moieties. Such compounds include those represented by structural formula (I):

(I)

wherein

$Q^1$ and $Q^2$ are independently aromatic tertiary amine moieties, and

G is a linking group such as arylene, cyclo-alkylene, or alkylene group or a carbon to carbon bond, at least one of $Q^1$ and $Q^2$ and G including a fused aromatic ring moiety as described above. In a specifically preferred form each of $Q^1$ and $Q^2$ includes a fused aromatic ring moiety, optimally a fused naphthyl moiety, bonded to an amine nitrogen atom. When G is an arylene moiety, it is preferably a phenylene, biphenylene or naphthylene moiety.

A particularly preferred class of triaryl-amines satisfying structural formula (I) and containing two triarylamine moieties are those satisfying structural formula (II):

(II)

where $R^1$ and $R^2$ each independently represents a hydrogen atom, an aryl group, or an alkyl group or $R^1$ and $R^2$ together represent the atoms completing a cycloalkyl group, and $R^3$ and $R^4$ each independently represents an aryl group which is in turn substituted with a diaryl substituted amino group, as indicated by structural formula (III):

(III)

wherein $R^5$ and $R^6$ are independently selected aryl groups. At least one of the aryl groups attached to the amine nitrogen atom of formula (III) is a fused aromatic ring moiety as described above. In a specifically preferred form at least one $R^5$ and $R^6$ is a fused aromatic ring moiety, optimally a naphthyl moiety.

Another preferred class of selected aromatic tertiary amines are tetraaryldiamines. Preferred tetraaryldiamines include two diarylamino groups, such as indicated by formula (III), linked through an arylene group. Preferred tetraaryldiamines include those represented by formula (IV).

(IV)

wherein

Ar, $Ar^1$, $Ar^2$ and $Ar^3$ are independently selected from among phenyl, biphenyl and naphthyl moieties, L is a divalent naphthylene moiety or $d_n$, d is a phenylene moiety, n is an integer of from 1 to 4, and at least one of Ar, $Ar^1$, $Ar^2$ and $Ar^3$ is a naphthyl moiety when L is $d_n$.

The various alkyl, alkylene, aryl, and arylene moieties of the foregoing structural formulae (I), (II), (III), and (IV) can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, e.g.

cyclopentyl, cyclohexyl, and cycloheptyl ring structures. When the aryl and arylene moieties are not fused aromatic ring moieties, they are preferably phenyl and phenylene moieties.

While the entire hole transporting layer of the organic light-emitting structure 120 (220) can be formed of a single selected aromatic tertiary amine of the type described above, it is recognized that combinations of selected aromatic tertiary amines can be employed to advantage and that combinations of selected aromatic tertiary amines of the type described above with aromatic tertiary amines of the type disclosed by VanSlyke et al U.S. Pat. No. 4,720,432, i.e., aromatic tertiary amines lacking a fused aromatic ring moiety, can be employed. Apart from the differences specifically noted, the teachings of VanSlyke et al U.S. Pat. No. 4,720,432, hereby incorporated by reference, are generally applicable to the internal junction organic EL devices of this invention.

Illustrative of useful selected (fused aromatic ring containing) aromatic tertiary amines are the following:

| | |
|---|---|
| ATA-1 | 4,4'-Bis[N-(1-naphthyl)-N-phenylamino]biphenyl |
| ATA-2 | 4,4"-Bis[N-(1-naphthyl)-N-phenylamino]-p-terphenyl |
| ATA-3 | 4,4'-Bis[N-(2-naphthyl)-N-phenylamino]biphenyl |
| ATA-4 | 4,4'-Bis[N-(3-acenaphthenyl)-N-phenyl-amino]biphenyl |
| ATA-5 | 1,5-Bis[N-(1-naphthyl)-N-phenylamino]naphthalene |
| ATA-6 | 4,4'-Bis[N-(9-anthryl)-N-phenylamino]-iphenyl |
| ATA-7 | 4,4"-Bis[N-(1-anthryl)-N-phenylamino]-p-terphenyl |
| ATA-8 | 4,4'-Bis[N-(2-phenanthryl)-N-phenyl-amino]biphenyl |
| ATA-9 | 4,4'-Bis[N-(8-fluoranthenyl)-N-phenyl-amino]biphenyl |
| ATA-10 | 4,4'-Bis[N-(2-pyrenyl)-N-phenylamino]bi-phenyl |
| ATA-11 | 4,4'-Bis[N-(2-naphthacenyl)-N-phenyl-amino]biphenyl |
| ATA-12 | 4,4'-Bis[N-(2-perylenyl)-N-phenylamino]biphenyl |
| ATA-13 | 4,4'-Bis[N-(1-coronenyl)-N-phenylamino]biphenyl |
| ATA-14 | 2,6-Bis(di-p-tolylamino)naphthalene |
| ATA-15 | 2,6-Bis[di-(1-naphtyl)amino]naphthalene |
| ATA-16 | 2,6-Bis[N-(1-naphthyl)-N-(2-naphthyl)-amino]naphthalene |
| ATA-17 | N,N,N',N'-Tetra(2-naphthyl)-4,4"-di-amino-p-terphenyl |
| ATA-18 | 4,4'-Bis{N-phenyl-N-[4-(1-naphthyl)-phenyl]amino}biphenyl |
| ATA-19 | 4,4'-Bis[N-phenyl-N-(2-pyrenyl)amino]biphenyl |
| ATA-20 | 2,6-Bis[N,N-di(2-naphthyl)amine]fluorene |
| ATA-21 | 1,5-Bis[N-(1-naphthyl)-N-phenylamino]naphthalene |

Both the organic light-emitting layer 124 and the organic electron-transporting layer 126 are constructed by vapor deposition of organic materials which have electron-transporting properties, and which are capable of thin film formation. Thus, both the light-emitting layer 124 and the electron-transporting layer 126 can be constructed from one or a combination of organic electron-transporting materials, with the light-emitting layer 124 containing, in addition, a dye capable of emitting light in response to hole-electron recombination, as will be described in more detail hereinafter.

Particularly preferred thin film forming materials for use in forming the electron-transporting and light-emitting layers of the organic light-emitting device 100 are metal chelated oxinoid compounds, including chelates of oxine itself (also commonly referred to as 8-quinolinol or 8-hydroxyquinoline). Such compounds exhibit both high levels of performance and are readily fabricated in the form of thin films. Exemplary of contemplated oxinoid compounds are those satisfying structural formula (V):

wherein
Me represents a metal,
n is an integer of from 1 to 3, and
Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds are the following:

| | |
|---|---|
| CO-1 | Aluminum trisoxine |
| | [a.k.a., tris(8-quinolinol) aluminum] |
| CO-2 | Magnesium bisoxine |
| | [a.k.a., bis(8-quinolinol)magnesium] |
| CO-3 | Bis[benzo{f}-8-quinolinol] zinc |
| CO-4 | Aluminum tris(5-methyloxine) |
| | [a.k.a., tris(5-methyl-8-quinolinol)aluminum] |
| CO-5 | Indium trisoxine |
| | [a.k.a., tris(8-quinolinol)indium] |
| CO-6 | Lithium oxine |
| | (a.k.a., 8-quinolinol lithium] |
| CO-7 | Gallium tris(5-chlorooxine) |
| | [a.k.a, tris(5-chloro-8-quinolinol)gallium] |
| CO-8 | Calcium bis(5-chlorooxine) |
| | a.k.a, bis(5-chloro-8-quinolinol)calcium] |
| CO-9 | Poly[zinc (II)-bis(8-hydroxy-5-quinolinyl)methane] |
| CO-10 | Dilithium epindolidione |

It is possible to modify the wavelength of emission from the light-emitting layer 124 and, in some instances, to increase the stability of the organic light-emitting device 100 in operation by incorporating in the light-emitting layer 124 a dye capable of emitting light in response to hole-electron recombination. To be useful for this purpose the dye must have a bandgap no larger than that of the host material in which it is dispersed and a reduction potential less negative than that of the host material. Tang et al. U.S. Pat. No. 4,769,292, the disclosure of which is hereby incorporated by reference, describes internal junction organic EL devices containing dyes selected from a variety of classes dispersed in electron-transporting host materials.

The preferred active materials forming the organic light-emitting structure 120 (220) are each film forming materials and capable of vacuum vapor deposition. Extremely thin defect free continuous layers can be formed by vacuum vapor deposition. Specifically, individual layer thicknesses as low as about 50 Angstroms can be present while still realizing satisfactory EL device performance. Employing a vacuum vapor deposited film forming aromatic tertiary amine as a hole transporting layer 122 (which can in turn be comprised of a triarylamine layer and a tetraaryldiamine layer), and a chelated oxinoid compound as an electron-transporting layer 126 and light-emitting layer 124, individual layer thicknesses in the range of from about 50 to 5000 Angstroms are contemplated, with layer thicknesses in the range of from 100 to 2000 Angstroms being preferred. It is generally preferred that the overall thickness of the organic device 100 to be at least about 1000 Angstroms.

Following the teachings of Tang et al. U.S. Pat. No. 4,885,211, the disclosure of which is hereby incorporated by reference, a preferred cathode 110 is one constructed of a combination of a metal having a work function less than 4.0 eV and one other metal, preferably a metal having a work function greater than 4.0 eV. The high and low work function metals can be employed in extremely wide proportions, ranging from <1 percent to >99 percent of the low work function metal with another metal, preferably a higher work function metal (e.g., a metal having a work function greater than 4.0 eV) forming the balance of the cathode. The Mg:Ag cathodes of Tang et al U.S. Pat. No. 4,885,211 constitute one preferred cathode construction. Aluminum and magnesium cathodes with magnesium constituting at least 0.05 (preferably at least 0.1) percent and aluminum constituting at least 80 (preferably at least 90) percent constitute another preferred cathode construction. The aluminum and magnesium cathodes are the subject matter of the VanSlyke et al U.S. Pat. No. 5,059,062, the disclosure of which is hereby incorporated by reference.

While the highest electron-injecting efficiencies from the cathode 110 across the interface 128 into the electron-transporting layer 126 are obtained from a cathode containing an alkali metal as the low work function metal, alkali metals have been excluded because they are too unstable for convenient use in a cathode 110 (or in a cathode 210) of prior art devices 100 and 200.

A listing of available low work function metal choices (other than alkali metals) for the cathodes 110 and 210, as well as available high work function metal choices for the cathodes, and for the anode 202 of FIG. 2, is given by Tang et al. U.S. Pat. No. 4,769,292, the disclosure of which is hereby incorporated by reference.

As indicated previously, the cathodes 110 and 210 are formed by conventional vapor co-deposition from one vapor source of a low (<4.0 eV) work function cathode material and from another vapor source of a high (>4.0 eV) work function cathode material.

Figure 3:
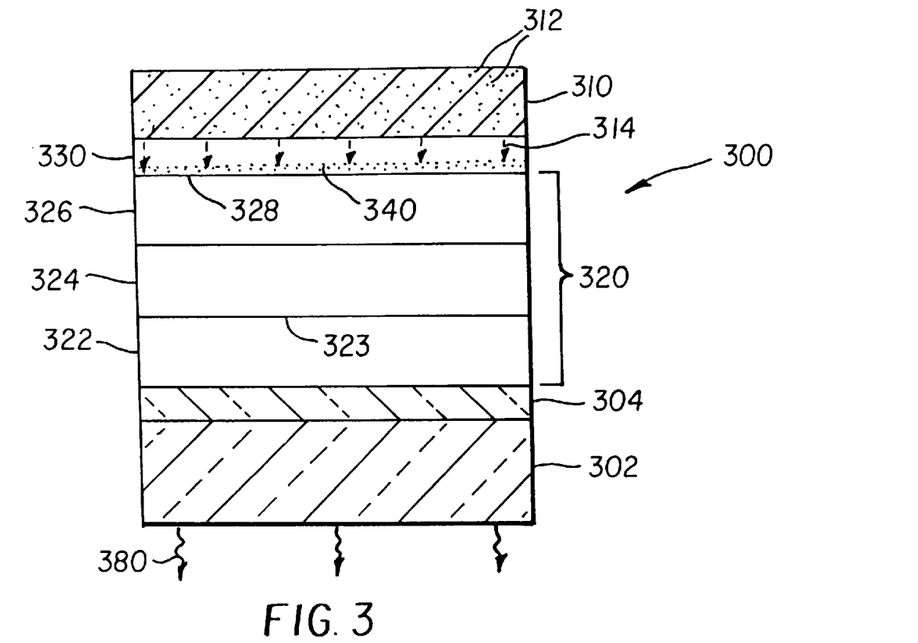
FIG. 3 is a schematic diagram of an organic light-emitting device in accordance with the present invention in which light is emitted through an anode and a support, and having a cathode formed by high energy deposition over an organic cathode buffer layer across which an electron-injecting dopant is diffused from the cathode to an interface between the buffer layer and an electron-transporting layer of an organic light-emitting structure.

Turning now to FIG. 3, an organic light-emitting device 300 is constructed in accordance with the present invention. A light-transmissive substrate 302, a light-transmissive anode 304, and an organic light-emitting structure 320, comprised of, in sequence, an organic hole-transporting layer 322, an organic light-emitting layer 324, and an organic electron-transporting layer 326 correspond to the elements 102, 104, 120, 122, 124, and 126, respectively of the prior art device 100 of FIG. 1. Similarly, the junction 323 and the interface 328, as well as the emitted light 380, correspond to the junction 123, the interface 128, and the emitted light 180 of the prior art device 100 of FIG. 1. Accordingly, the aforementioned corresponding elements of the organic light-emitting device 300 and their construction and function require no further description.

Figure 4:
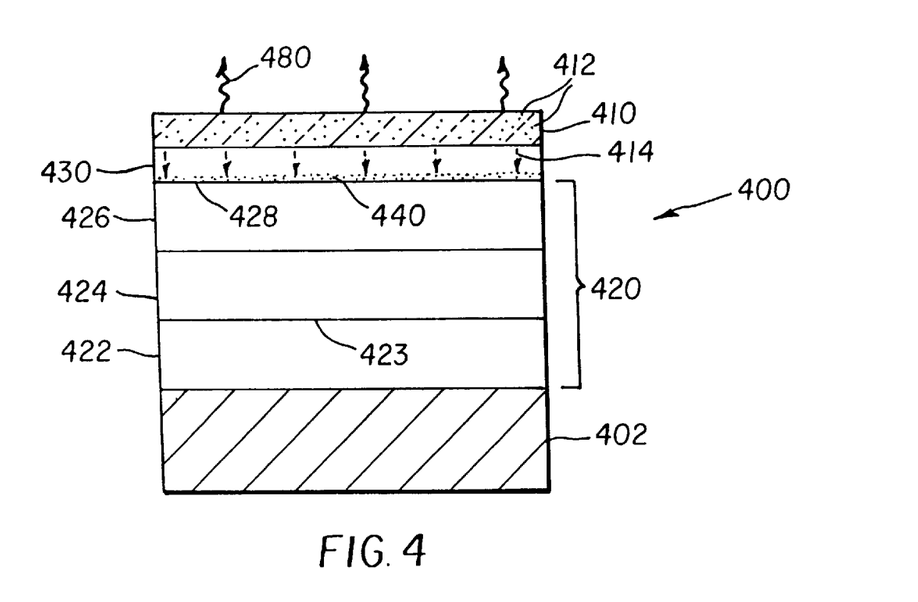
FIG. 4 is a schematic diagram of an organic light-emitting device in accordance with the present invention in which light is emitted through a cathode, and having the cathode formed by high energy deposition over an organic cathode buffer layer across which an electron-injecting dopant is diffused from the cathode to an interface between the buffer layer and an electron-transporting layer of an organic light-emitting structure.

Likewise, the organic light-emitting device 400 of FIG. 4 has an optically opaque substrate and anode electrode 402 over which is disposed an organic light-emitting structure 420 which is comprised of, in sequence, an organic hole-transporting 422, an organic light-emitting layer 424, and an organic electron-transporting layer 426. The organic light-emitting device 400 further comprises a junction 423, and an interface 428. Each of these elements corresponds in the construction and function to the construction and function of elements 202, 220, 222, 223, 224, 226, and 228, respectively, of the prior art device 200 of FIG. 2.

Viewing FIGS. 3 and 4 together, it has been found unexpectedly that an organic cathode buffer layer 330 (430) formed over the electron-transporting layer 326 (426) permits high energy deposition of a cathode 310 (410) on the device 300 (400) by sputter deposition or by electron beam deposition. Surprisingly, the organic cathode buffer layer 330 (430), which has a preferred thickness in a range of 10–50 nm, is an effective protection layer which protects the organic light-emitting structure 320 (420) from damage induced by electron bombardment or ion bombardment present during a high energy deposition of a cathode, such as sputter deposition or electron beam deposition.

Similar to the cathodes 110 and 210 of the prior art devices 100 and 200 (see FIGS. 1 and 2), the cathode 310 (410) is a composite which contains a high work function (>4.0 eV) cathode material and a low work function (<4.0 eV) cathode material. However, in contrast to the aforementioned prior art cathodes 110 and 210, the cathode 310 (410) contains a low work function cathode material selected from materials at least a portion of which can diffuse from the cathode 310 (410) and across the organic cathode buffer layer 330 (430) so as to provide an interfacial electron-injecting layer 340 (440) at an interface 328 (428) between the electron-transporting layer 326 (426) of the light-emitting structure 320 (420) and the cathode buffer layer 330 (430). The diffusion is schematically indicated by dashed arrows 314 (414) in FIGS. 3 and 4.

The low work function cathode material, capable of diffusion, is referred to hereinafter as an electron-injecting dopant, and is depicted in dotted outline at 312 (412) in the cathode 310 (410).

The cathode 310 (410) is preferably formed by high energy sputter deposition in a sputter system which has a sputter target comprised of a cathode-forming material selected to have a work function greater than 4.0 eV, and electron-injecting dopant material selected to have a work function less than 4.0 eV. The high work function cathode material preferably consists of elemental metals to form the cathode 310 of FIG. 3, and preferably consists of electrically conductive and light-transmissive metal oxides to form the cathode 410 of FIG. 4.

It is estimated that the interfacial electron-injecting layer 340 (440) can be as thin as a few atomic monolayers of the electron-injecting dopant to provide effective electron injection into the organic electron-transporting layer 326 (426) at the interface 328 (428), when the cathode is biased at a more negative electrical potential with respect to the anode. Such interfacial electron-injecting layers can be readily achieved by diffusion of only a portion of the dopant 312 (412) from the cathode 310 (410) across the cathode buffer layer 330 (430) if the electron-injecting dopant material is provided in the cathode at a concentration in a preferred range of 0.5–10 atomic weight percent.

Preferred electron-injecting dopant materials 312 (412), capable of diffusion across the cathode buffer layer, are selected from the Periodic Table groups IA and IIA. Examples of such materials are cesium, lithium, calcium and magnesium.

At least a portion of the aforementioned dopants diffuses from the cathode 310 (410) across the organic cathode buffer layer 330 (430) during the high energy cathode deposition in which the buffer layer, and the cathode being formed, may be at a temperature in a range of 20–80° C. An actually measured temperature depends on several factors including cathode deposition conditions such as, for example, deposition power, deposition rate, deposition duration, and on the presence or absence of temperature-controlled substrate mounting means during the cathode deposition. At any rate, the cathode buffer layer 330 (430), and the cathode being formed, are maintained during the cathode deposition at a temperature sufficient to diffuse at least a portion of the dopant from the cathode 310 (410) across the cathode buffer layer 330 (430) to provide the interfacial electron-injecting layer 340 (440).

It has now been found that an organic cathode buffer layer 330 (430), effective as a protection layer, can be formed of a porphyrinic compound by conventional thermal vapor deposition at a preferred thickness in a range of 10–100 nm. A porphyrinic compound is any compound, natural or synthetic, which is derived from or includes a porphyrin structure, including porphine itself. Any of the porphyrinic compounds disclosed by Adler U.S. Pat. No. 3,935,031 or Tang U.S. Pat. No. 4,356,429, the disclosures of which are hereby incorporated by reference, can be employed.

Preferred porphyrinic compounds are those of structural formula (VI):

(VI)

wherein

Q is —N=or —C(R)=,

M is a metal, metal oxide, or metal halide,

R is hydrogen, alkyl, aralkyl, aryl, or alkaryl, and $T^1$ and $T^2$ represent hydrogen or together complete an unsaturated 6-membered ring, which can include substituents, such as alkyl or halogen. Preferred 6-membered rings are those formed of carbon, sulfur, and nitrogen ring atoms. Preferred alkyl moieties contain from about 1 to 6 carbon atoms while phenyl constitutes a preferred aryl moiety.

In an alternative, preferred form the porphyrinic compounds differ from those of structural formula (VI) by substitution of two hydrogen for the metal atom, as indicated by formula (VII):

(VII)

Highly preferred examples of useful porphyrinic compounds are metal free phthalocyanines and metal containing phthalocyanines. While the porphyrinic compounds in general and the phthalocyanines in particular can contain any metal, the metal preferably has a positive valence of two or higher. Exemplary preferred metals are cobalt, magnesium, zinc, palladium, nickel, and, particularly, copper, lead, and platinum.

| | |
|---|---|
| PC-1 | Porphine |
| PC-2 | 1,10,15,20-Tetraphenyl-21H,23H--porphine copper (II) |
| PC-3 | 1,10,15,20-Tetraphenyl-21H,23H--porphine zinc (II) |
| PC-4 | 5,10,15,20-Tetrakis(pentafluorophenyl)-21H,23H-porphine |
| PC-5 | Silicon phthalocyanine oxide |
| PC-6 | Aluminum phthalocyanine chloride |
| PC-7 | Phthalocyanine (metal free) |
| PC-8 | Dilithium phthalocyanine |
| PC-9 | Copper tetramethylphthalocyanine |
| PC-10 | Copper phthalocyanine |
| PC-11 | Chromium phthalocyanine fluoride |
| PC-12 | Zinc phthalocyanine |
| PC-13 | Lead phthalocyanine |
| PC-14 | Titanium phthalocyanine oxide |
| PC-15 | Magnesium phthalocyanine |
| PC-16 | Copper octamethylphthalocyanine |

A cathode buffer layer consisting of a porphyrinic compound not only serves as a protection layer for the underlying light-emitting structure 320 (420) but also permits diffusion of the electron-injecting dopant there across.

A cathode buffer layer consisting of a phthalocyanine, particularly of a metal containing phthalocyanine, and specifically a copper phthalocyanine, is substantially light-transmissive even at a buffer layer thickness of approximately 250 nm, i.e. a thickness significantly greater than a preferred buffer layer thickness in a range of 10–100 nm.

Figure 5:
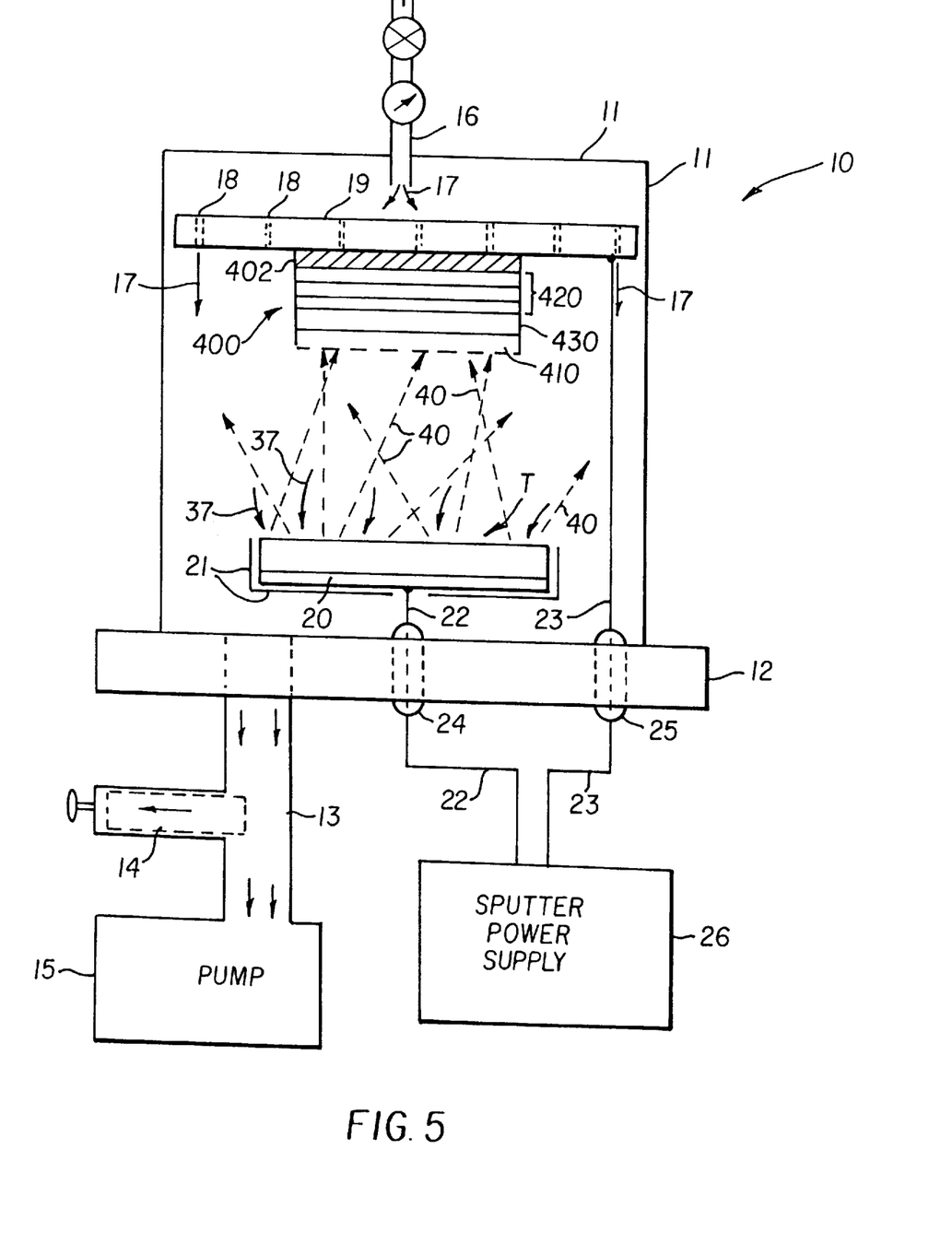
FIG. 5 is a schematic diagram of a sputter deposition system useful for high energy deposition of a cathode over an organic cathode buffer layer of an organic light-emitting device, in accordance with the present invention.

Turning now to FIG. 5, there is shown a schematic diagram of a sputter deposition system 10 useful for depositing a cathode on an organic light-emitting device 400, which is shown in FIG. 5 for illustrative purposes only. The system 10 has a chamber 11 which forms a vacuum seal (not shown) to a base plate 12. A pump conduit 13 extends through the base plate 12 and is connected to a pump 15 via a control valve 14. A gas conduit 16 shown in an upper portion of the chamber 11 introduces into the chamber a regulated flow of a sputter gas 17, for example, an argon gas or a xenon gas. The sputter gas 17 flows through gas flow distributors 18 formed in a support plate 19, whereby a flow rate of the sputter gas 17 is determined by several factors, including a gas flow rate entering the chamber through the gas conduit 16 and a gas flow rate extracted from the chamber by the pump 15 via the pump conduit 13. The device 400 of FIG. 4 is shown schematically as being fixedly attached at its substrate 402 to the support plate 19. A sputter power supply 26, which can be a DC power supply or an RF power supply, is connected by a lead 23, passing through a feedthrough 25, to the support plate 19, and the sputter power supply 26 is connected via a lead 22, through a feedthrough 24, to a target backing plate 20 which supports a target T. As is well known, the target T and the target backing plate 20 are shielded by a shield 21, also referred to as a dark space shield by those skilled in the art of sputter deposition systems.

Ions of the sputter gas 17, shown by curved bold arrows 37, are bombarding the target T and are sputtering off the target energetic atoms or molecules, shown by dashed arrows designated at 40. The atoms or molecules 40 correspond in composition to the composition of the target T, and form the cathode 410 over the cathode buffer layer 430, as indicated schematically by the dashed upper surface of the cathode 410 during its formation by high energy sputter deposition.

A sputter deposition target T or an electron beam deposition target (not shown) can be formulated and constructed as a composite target by those skilled in this art. A composite target can be an alloy target containing at least two selected cathode materials of a work function greater than 4.0 eV. For example, alloy targets of aluminum and silicon or of chromium and nickel can be readily fabricated. Composite targets from which light-transmissive layers can be formed include indium tin oxide (ITO), aluminum- or indium-doped zinc oxide, and cadmium tin oxide. Each of the above high (>4.0 eV) work function composite target materials will further contain a low (<4.0 eV) work function dopant material, preferably one of calcium, cesium, lithium, and magnesium, which will provide the electron-injecting function of the interfacial layer 340 (440). The low work function dopant material has a concentration in the target in a preferred range of 0.5–10.0 atomic weight percent.

EXAMPLES

The following examples are presented for a further understanding of the invention. For purposes of brevity, the materials and the layers formed therefrom will be abbreviated as given below:

ITO: indium tin oxide (anode)
CuPc: copper phthalocyanine (cathode buffer layer; and a hole-injecting layer disposed over the anode)
NPB: 4,4'-bis-[N-(1-naphthyl)-N-phenylamino]-bi-phenyl (hole-transporting layer)
Alq: tris (8-quinolinolato-N1, 08)-aluminum (electron-transporting layer; functioning here as a combined light-emitting layer and electron-transporting layer)
MgAg: magnesium: silver at a ratio of 10:1 by volume (cathode)
Ag: silver (cathode)
Al: aluminum (cathode)
Li: lithium (electron-injecting dopant layer disposed over cathode buffer layer)

I. Preparation of an Organic Light-Emitting Structure

An organic light-emitting structure was constructed in the following manner:

a) a light-transmissive anode of ITO-coated glass was ultrasonicated in a commercial detergent, rinsed in deionized water, degreased in toluene vapor, and contacted by a strong oxidizing agent;

b) a 15 nm thick CuPc hole-injecting layer was deposited on the anode by conventional thermal vapor deposition;

c) a 65 nm thick NPB hole-transporting layer was deposited on the CuPc layer by conventional thermal vapor deposition;

d) a 75 nm thick Alq electron-transporting and light-emitting layer was deposited on the NPB layer by conventional thermal vapor deposition.

The above structure serves as a base configuration for each of the following examples, and is given in abbreviated form as ITO/CuPc(15)/NPB(65)/Alq(75).

Example A

An organic light-emitting device was constructed as follows: a MgAg cathode was deposited on the Alq (75) layer of the base configuration by conventional thermal vapor deposition from two sources (Mg & Ag) to a thickness of about 200 nm, so as to provide a prior art cathode.

Example B

An organic light-emitting device was constructed as follows: a CuPc cathode buffer layer was deposited on the Al (q) layer of the base configuration by conventional thermal vapor deposition to a thickness of 15 nm, and then a MgAg cathode was deposited on the CuPc cathode buffer.

Example C

An organic light-emitting device was constructed as follows: a Li-doped Al was sputter-deposited on the Alq (75) layer of the base configuration by radio frequency (RF) sputtering to a thickness of 100 nm, so as to provide a cathode.

Example D

An organic light-emitting device was constructed as follows: a Li-doped Al film was sputter-deposited on the Alq (15) layer of the base configuration by DC sputtering to a thickness of 100 nm, so as to provide a cathode.

Example E

An organic light-emitting device was constructed as follows: a CuPc cathode buffer layer was deposited on the Alq (75) layer of the base configuration by conventional thermal vapor deposition to a thickness of 15 nm, and then a lithium-doped buffer cathode layer was deposited on the CuPc layer by RF sputtering to a thickness of 100 nm, so as to provide a cathode.

Example F

An organic light-emitting device was constructed as follows: a CuPc cathode buffer layer was deposited on the Alq (75) layer of the base configuration by conventional thermal vapor deposition to a thickness of 15 nm, and then a lithium-doped buffer cathode layer was deposited on the CuPc layer by DC sputtering to a thickness of 100 nm, so as to provide a cathode.

Electrical shorts were commonly observed in Example C and D, but the number of shorted devices was greatly reduced in Example E and F. Each of the devices was tested by applying a drive voltage between the anode and cathode, such that the anode was positive with respect to the cathode. A current-drive voltage relationship was determined and displayed in FIGS. 6A, 7A, and 8A, and a relationship between electroluminescence (EL) light output and current density was determined and shown in FIGS. 6B, 7B, and 8B.

Figure 6A:
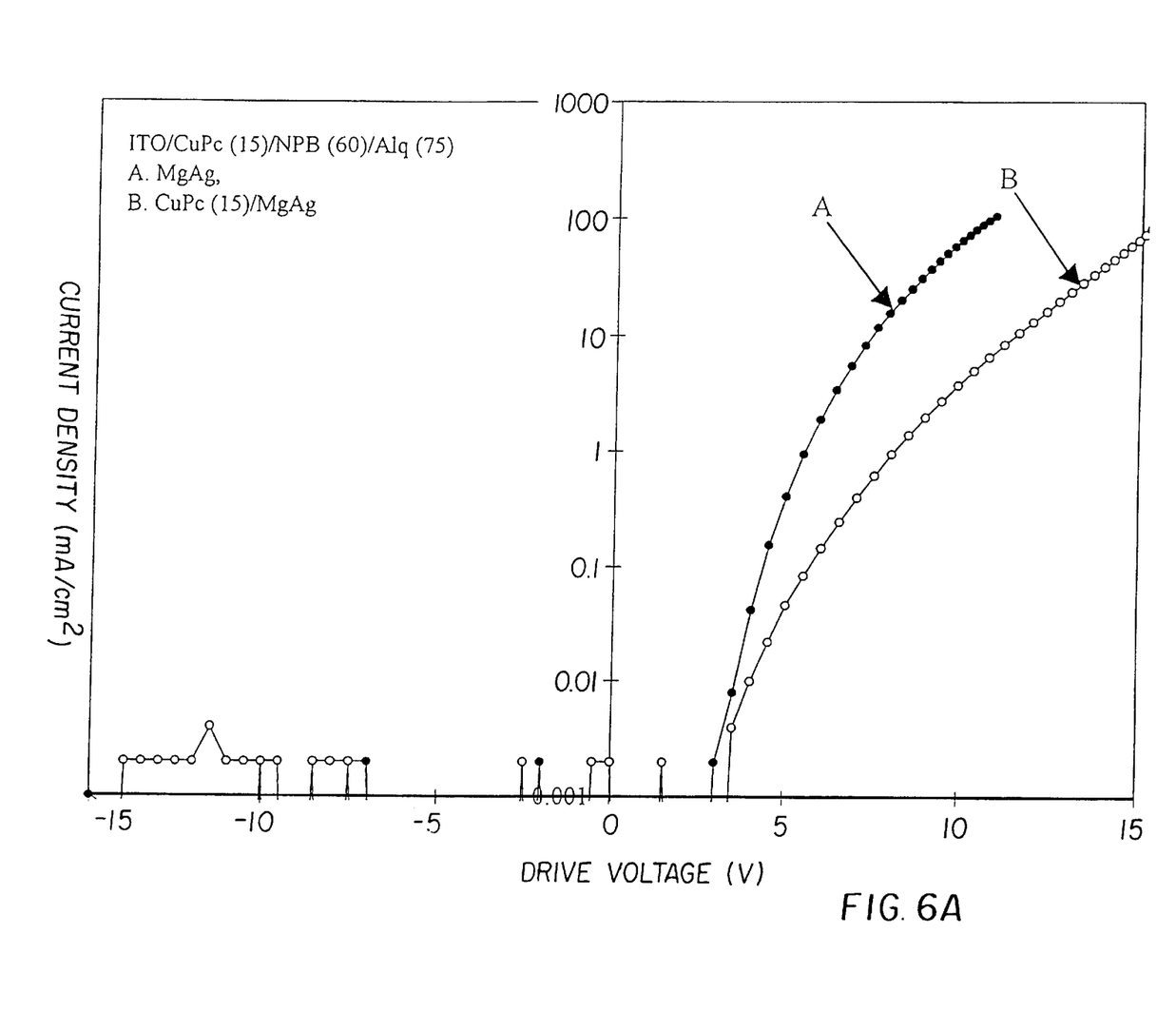
FIG. 6A shows in graphic form the current-voltage relationships of organic light-emitting devices constructed with and without an organic cathode buffer layer.
Figure 6B:
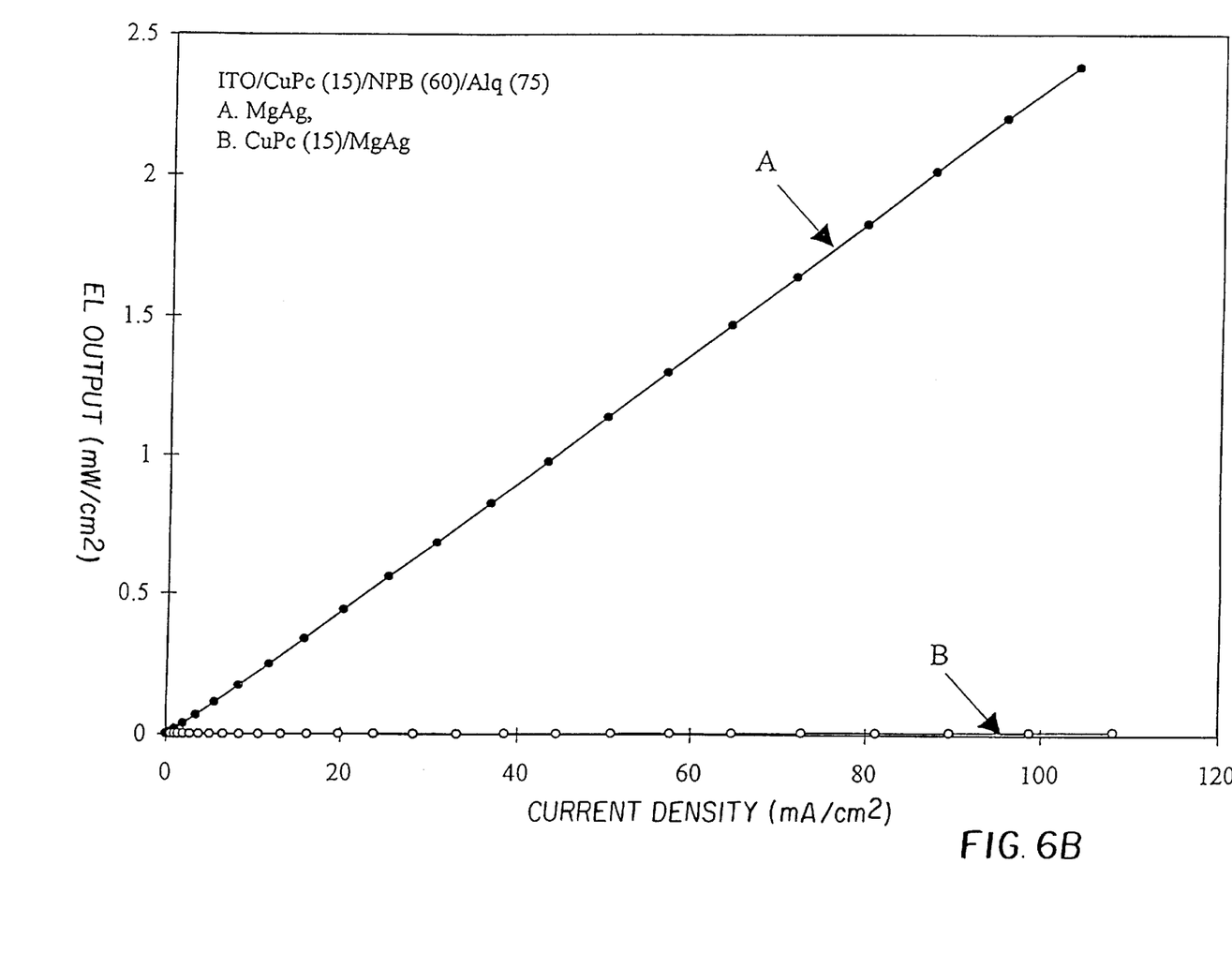
FIG. 6B shows in graphic form the relationship between an electroluminescence light output and a drive current of the devices of FIG. 6A.

Viewing FIGS. 6A and 6B, it is apparent that a CuPc layer interposed between Alq and MgAg in Example B deteriorated the current-drive voltage relationship, as compared to the prior art in Example A with the MgAg cathode deposited directly on the Alq (75) layer of the base configuration. It is more surprising that the EL output of the device in Example B is almost nought, while the device in Example A showed strong electroluminescence with an efficiency of about 2.5× $10^{-2}$ W/A. The differences in electrical and optical properties clearly indicate that there is an electron injection barrier between CuPc and Alq, so the electrons and holes recombined in the CuPc near the CuPc-Alq interface and generated extremely weak electroluminescence.

Figure 7A:
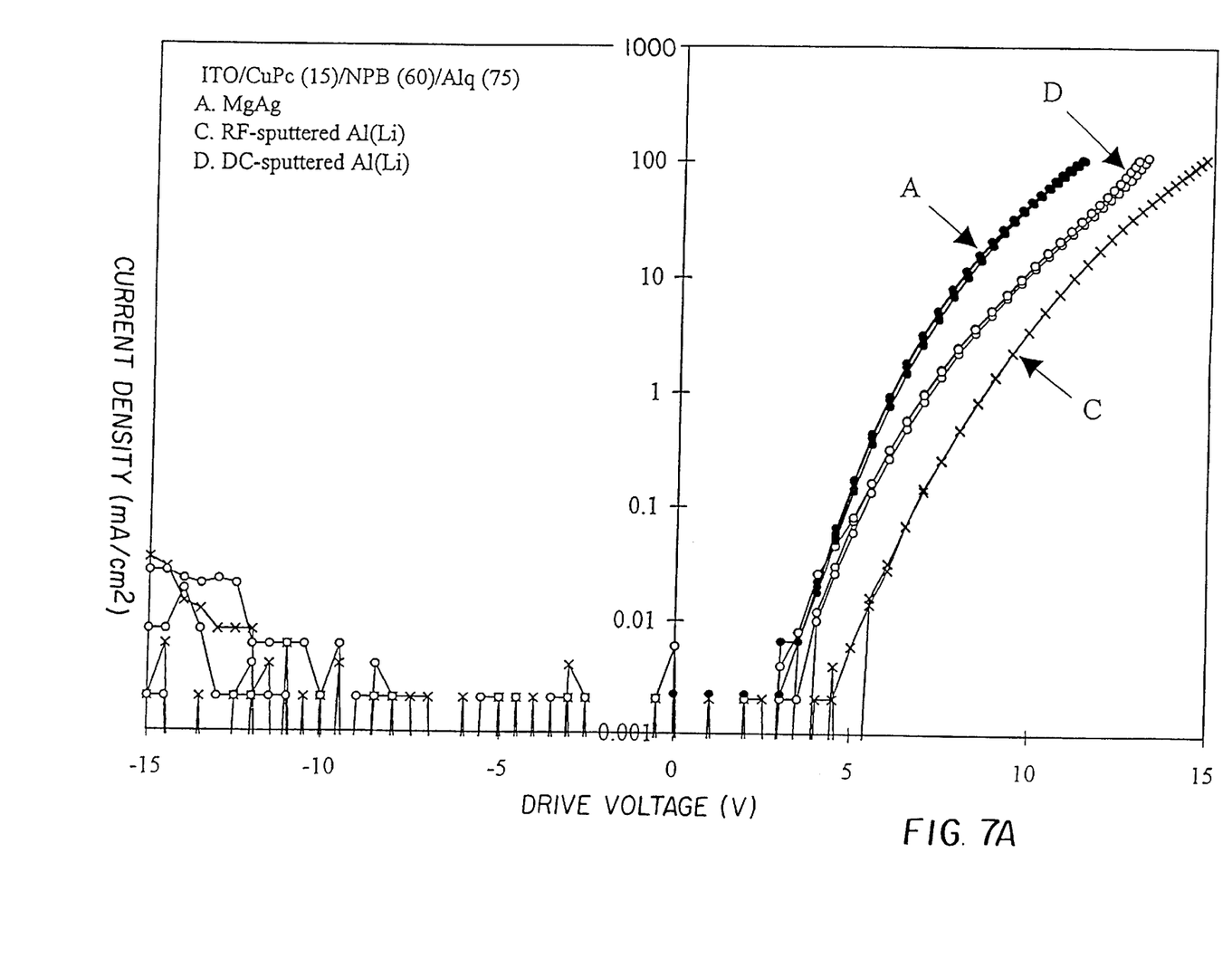
FIG. 7A shows in graphic form the current-voltage relationships of organic light-emitting devices constructed with an evaporated MgAg cathode and with a sputtered Li-doped Al cathode.
Figure 7B:
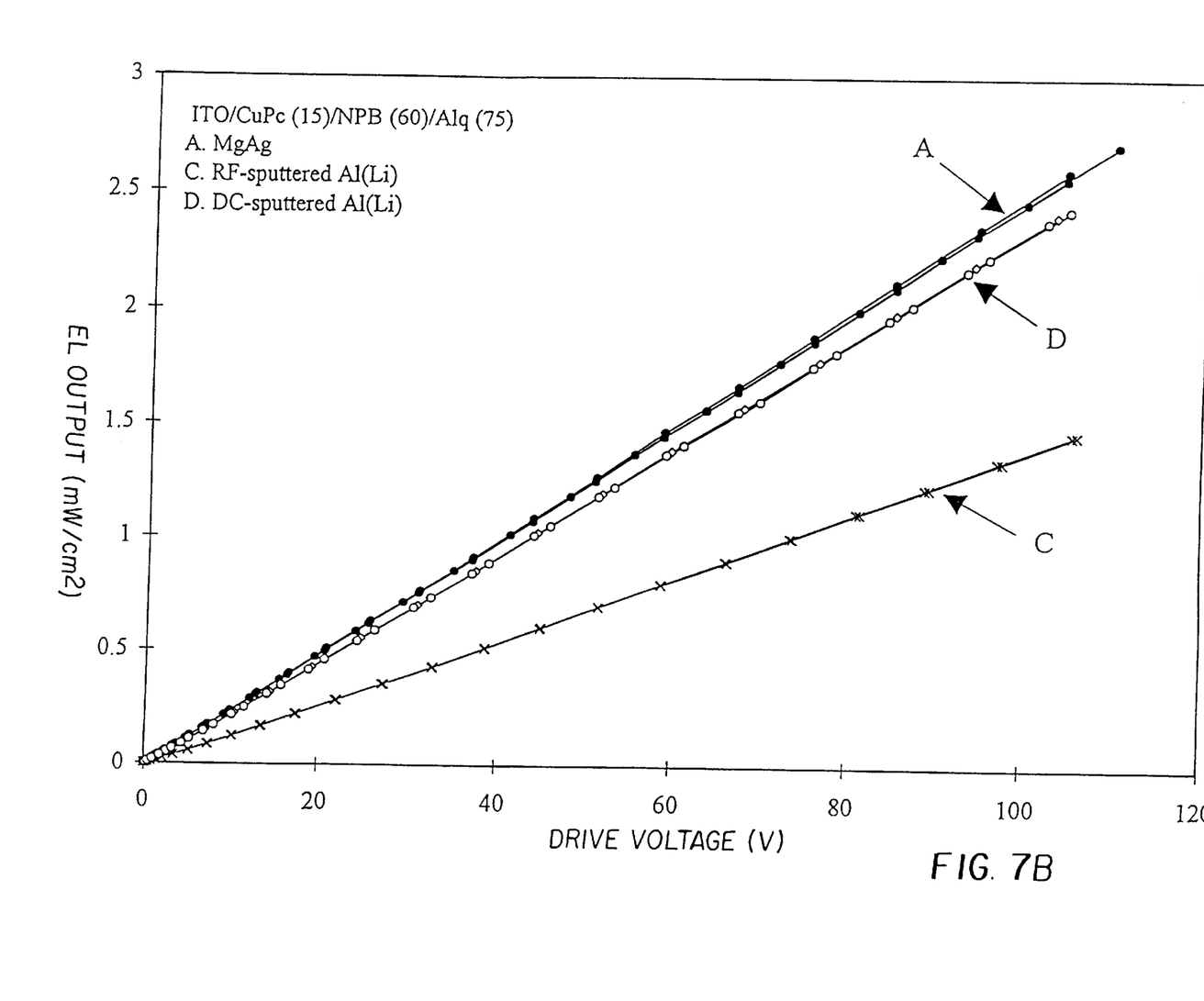
FIG. 7B shows in graphic form the relationship between an electroluminescence light output and a drive current of the devices of FIG. 7A.

In FIGS. 7A and 7B the results obtained from Examples A, C, and D are shown. When the cathodes of organic EL devices were prepared by sputtering deposition on the Al (75) layer of the base configuration, both electrical and optical properties were severely deteriorated, as compared to the prior art in Example A because the organic EL devices are extremely sensitive to radiation damaging and electrical charging. As a result, the damaged devices showed higher drive voltages and lower EL efficiencies.

Figure 8A:
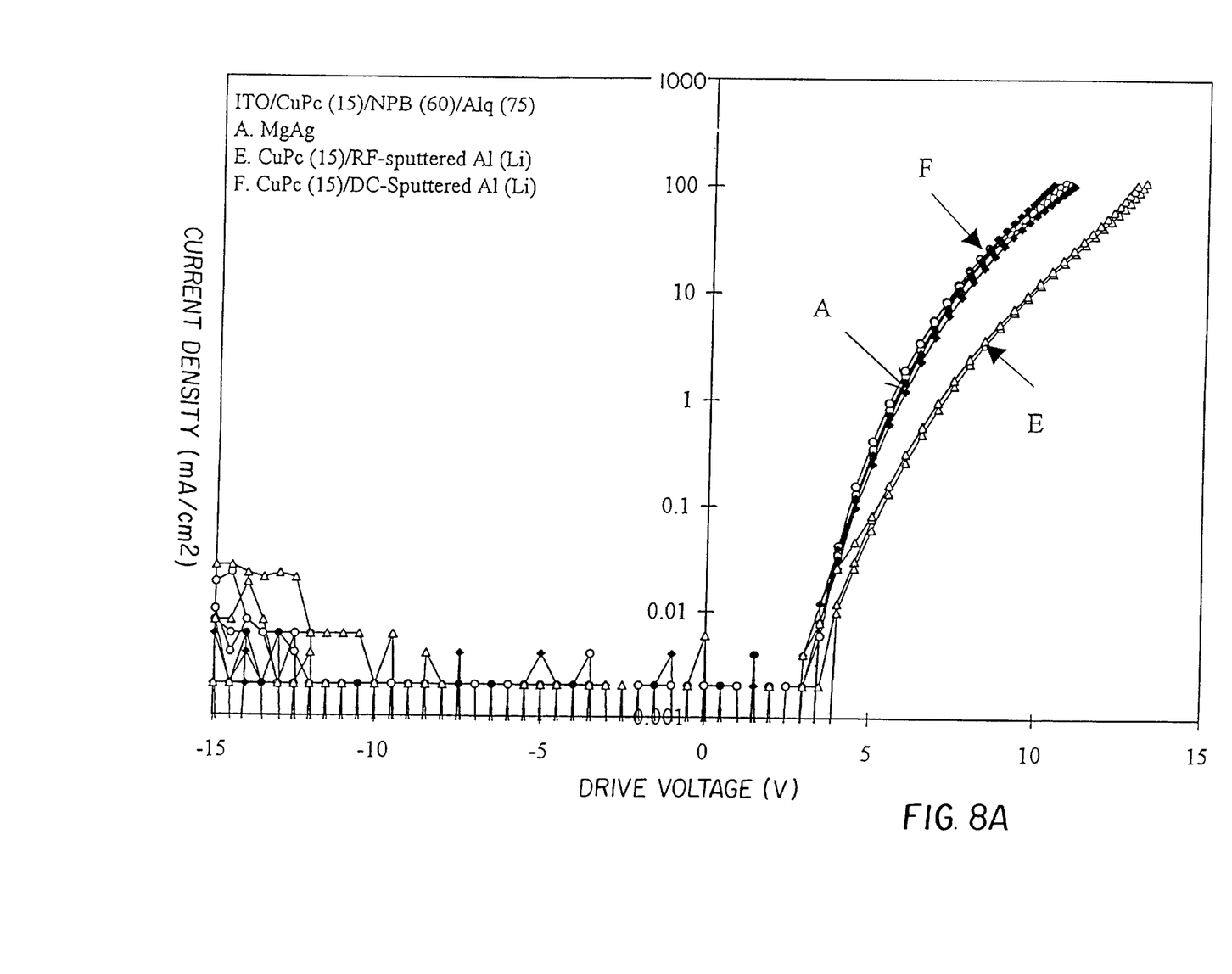
FIG. 8A shows in graphic form the current-voltage relationships of organic light-emitting devices constructed with an evaporated MgAg cathode on Alq and with a Li-doped Al cathode sputter-deposited on a cathode buffer layer.
Figure 8B:
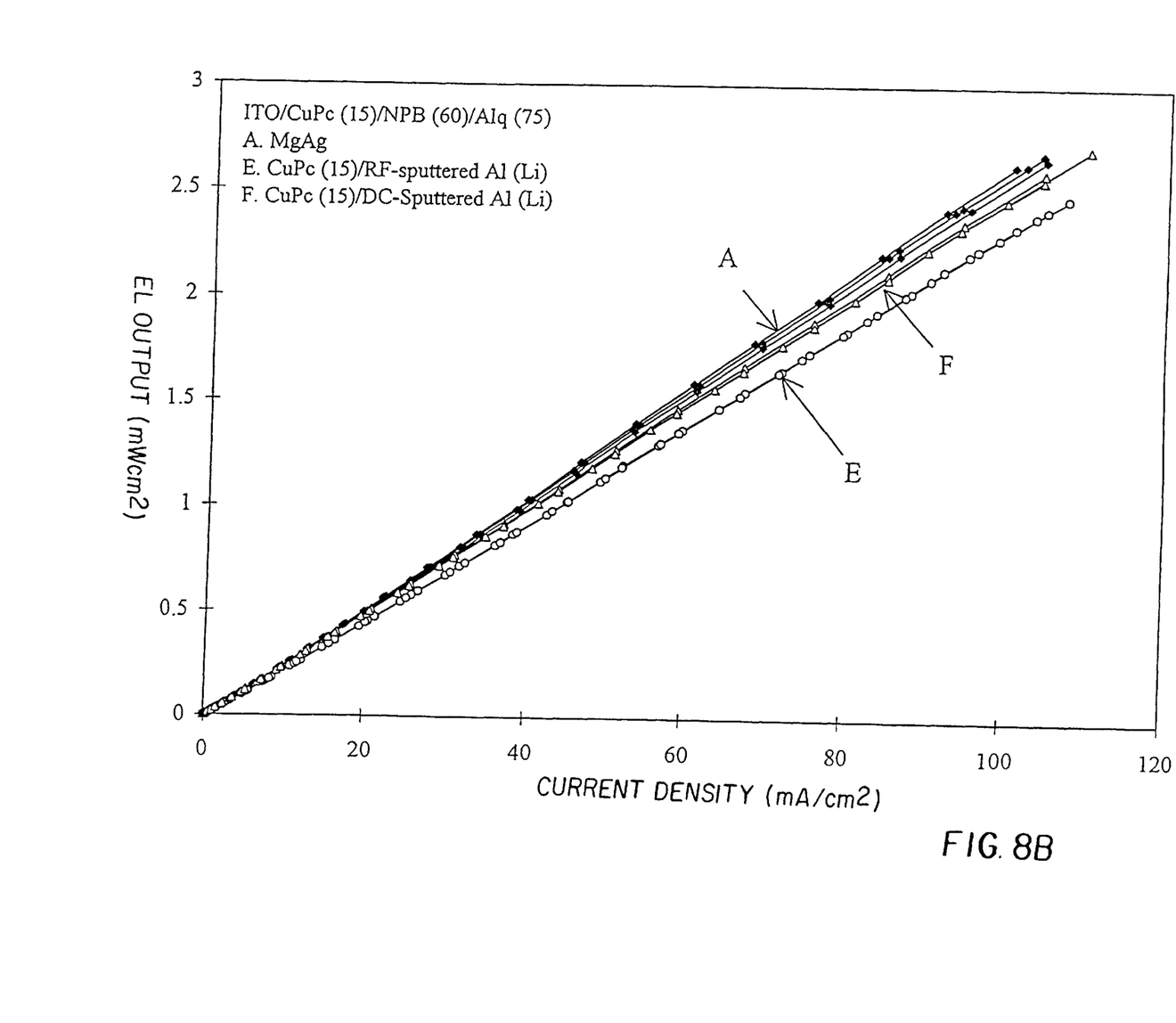
FIG. 8B shows in graphic form the relationship between an electroluminescence light output and a drive current of the devices of FIG. 8A.

As is shown in FIGS. 8A and 8B, however, when the CuPc was used as a cathode buffer layer for sputtering deposition of the Li-doped Al, the devices prepared by DC sputtering exhibited almost identical electrical and optical characteristics to those obtained from the prior art in Example A. The devices prepared by RF sputtering also showed significant improvements on device performance as compared to the devices in Example C. The results clearly indicate that a thin CuPc layer is sufficient to protect the organic EL device during sputtering deposition. Measurements on Li profiles using x-ray photoelectron spectroscopy revealed some Li in the CuPc layer as well as at the CuPc-Alq interface. The presence of Li at the interface by dopant diffusion from the cathode material substantially lowered the electron injection barrier. As a result, the recombination zone of electrons and holes is located in the Alq near the NPB-Alq interface, thus generating strong electroluminescence.

The invention has been described in detail with particular reference to certain preferred embodiments thereof, but it will be understood that variations and modifications can be effected within the spirit and scope of the invention.

PARTS LIST

| | |
|---|---|
| 10 | sputter deposition system |
| 11 | chamber |
| 12 | base plate |
| 13 | pump conduit |
| 14 | control valve |
| 15 | pump |
| 16 | gas conduit |
| 17 | sputter gas |
| 18 | gas flow distributors |
| 19 | support plate |
| 20 | target backing plate |
| 21 | shield |
| 22 | lead |
| 23 | lead |
| 24 | feedthrough |
| 25 | feedthrough |
| 26 | sputter power supply |
| 37 | gas ions |
| 40 | sputtered target atoms or molecules |
| T | sputter target |
| 100 | organic light-emitting device (prior art) |

-continued

PARTS LIST

| | |
|---|---|
| 102 | light-transmissive substrate |
| 104 | light-transmissive anode |
| 110 | optically opaque cathode |
| 120 | organic light-emitting structure |
| 122 | hole-transporting layer |
| 123 | junction |
| 124 | light-emitting layer |
| 126 | electron-transporting layer |
| 128 | interface |
| 180 | emitted light |
| 200 | organic light-emitting device (prior art) |
| 202 | optically opaque substrate, and anode |
| 210 | light-transmissive cathode |
| 220 | organic light-emitting structure |
| 222 | hole-transporting layer |
| 223 | junction |
| 224 | light-emitting layer |
| 226 | electron-transporting layer |
| 228 | interface |
| 280 | emitted light |
| 300 | organic light-emitting device |
| 302 | light-transmissive substrate |
| 304 | light-transmissive anode |
| 310 | optically opaque cathode |
| 312 | electron-injecting dopant in cathode |
| 314 | arrows indicating dopant diffusion |
| 320 | organic light-emitting structure |
| 322 | hole-transporting layer |
| 323 | junction |
| 324 | light-emitting layer |
| 326 | electron-transporting layer |
| 328 | interface |
| 330 | organic cathode buffer layer |
| 340 | interfacial electron-injecting dopant layer |
| 380 | emitted light |
| 400 | organic light-emitting device |
| 402 | optically opaque substrate, and anode |
| 410 | light-transmissive cathode |
| 412 | electron-injecting dopant in cathode |
| 414 | arrows indicating dopant diffusion |
| 420 | organic light-emitting structure |
| 422 | hole-transporting layer |
| 423 | junction |
| 424 | light-emitting layer |
| 426 | electron-transporting layer |
| 428 | interface |
| 430 | organic cathode buffer layer |
| 440 | interfacial electron-injecting dopant layer |
| 480 | emitted light |

What is claimed is:

1. An organic light-emitting device comprising:

a) a substrate;

b) an anode disposed over the substrate;

c) an organic light-emitting structure disposed over the anode;

d) a cathode buffer layer including a porphyrinic compound disposed over the organic light-emitting structure and formed of a material selected to permit high energy deposition of a cathode; and e) a cathode disposed over the cathode buffer layer and being provided with an electron-injecting dopant which diffuses across the buffer layer to provide an interfacial electron-injecting layer at the interface between the organic light-emitting structure and the cathode buffer layer.

2. The organic light-emitting device of claim 1 wherein the substrate is an electrically insulative and light-transmissive substrate.

3. The organic light-emitting device of claim 2 wherein the anode is a light-transmissive anode having a work function greater than 4 electron volt (eV).

4. The organic light-emitting device of claim 3 wherein light is emitted from the organic light-emitting structure through the anode and the substrate when the anode is at a sufficient positive electrical potential with respect to the cathode.

5. The organic light-emitting device of claim 1 wherein the substrate is an optically opaque substrate.

6. The organic light-emitting device of claim 4 wherein the anode has a work function greater than 4 eV and is electrically conductive.

7. The organic light-emitting device of claim 6 wherein light is emitted from the organic light-emitting structure through the cathode buffer layer and through a light-transmissive cathode when the anode is at a sufficient positive electrical potential with respect to the cathode.

8. The organic light-emitting device of claim 1 wherein the organic light-emitting structure is comprised of:

(i) an organic hole-transporting layer formed over the anode;

(ii) an organic light-emitting layer formed over the hole-transporting layer; and (iii) an organic electron-transporting layer formed over the light-emitting layer.

9. The organic light-emitting device of claim 8 wherein the organic hole-transporting layer includes hole-transporting aromatic tertiary amine molecules.

10. The organic light-emitting device of claim 8 wherein the organic light-emitting layer includes a light-emitting metal chelated oxinoid compound.

11. The organic light-emitting device of claim 10 wherein the organic light-emitting layer further includes at least one dye capable of emitting light when dispersed in light-emitting host material.

12. The organic light-emitting device of claim 8 wherein the electron-transporting layer includes a metal chelated oxinoid compound.

13. The organic light-emitting device of claim 1 wherein a selected porphyrinic compound is a phthalocyanine compound.

14. The organic light-emitting device of claim 13 wherein the phthalocyanine compound is a metal phthalocyanine.

15. The organic light-emitting device of claim 14 wherein a selected metal phthalocyanine is copper phthalocyanine.

16. The organic light-emitting device of claim 1 wherein the cathode buffer layer has a thickness in a range of 5–100 nm.

17. The organic light-emitting device of claim 16 wherein the cathode buffer layer is a light-transmissive layer.

18. The organic light-emitting device of claim 17 wherein the cathode buffer layer protects the organic light-emitting structure from damage during a high energy deposition of a cathode.

19. The organic light-emitting device of claim 1 wherein the cathode is formed by high energy sputter deposition of a layer comprised of a cathode electrode material and an electron-injecting dopant material.

20. The organic light-emitting device of claim 19 wherein the cathode electrode material is selected to have a work function greater than 4 eV, and the electron-injecting dopant material is selected to have a work function less than 4 eV.

21. The organic light-emitting device of claim 20 wherein the cathode electrode material is selected from the group consisting of elemental metals and electrically conductive metal oxides.

22. The organic light-emitting device of claim 20 wherein the electron-injecting dopant material is selected from the Periodic Table groups IA and IIA.

23. The organic light-emitting device of claim 20 wherein the electron-injecting dopant material is provided in the cathode electrode material at a concentration in a range of 0.5–10 atomic weight percent.

* * * * *